(12) United States Patent
Benavides et al.

(10) Patent No.: US 7,348,799 B2
(45) Date of Patent: Mar. 25, 2008

(54) SYSTEM AND METHOD FOR GENERATING A TRIGGER SIGNAL

(75) Inventors: John A. Benavides, Garland, TX (US); Tyler J. Johnson, Murphy, TX (US); Ryan Lee Akkerman, Allen, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 415 days.

(21) Appl. No.: 11/032,949

(22) Filed: Jan. 11, 2005

(65) Prior Publication Data
US 2006/0170452 A1    Aug. 3, 2006

(51) Int. Cl.
G06F 7/38    (2006.01)
G06F 12/00   (2006.01)
H03K 19/173  (2006.01)

(52) U.S. Cl. .................. 326/46; 711/100; 712/232
(58) Field of Classification Search ............. 326/46; 712/232
See application file for complete search history.

(56) References Cited

U.S. PATENT DOCUMENTS

| | | | |
|---|---|---|---|
| 4,791,356 A | | 12/1988 | Warren et al. |
| 5,650,734 A | * | 7/1997 | Chu et al. .................. 326/38 |
| 5,778,251 A | * | 7/1998 | Kuroiwa et al. ............ 710/14 |
| 5,825,199 A | * | 10/1998 | Shelton et al. ............. 326/38 |
| 5,828,872 A | * | 10/1998 | Watkins ..................... 713/600 |
| 5,850,512 A | | 12/1998 | Song |
| 5,880,671 A | | 3/1999 | Ranson et al. |
| 5,881,224 A | | 3/1999 | Ranson et al. |
| 5,949,251 A | * | 9/1999 | Chambers .................. 326/46 |
| 5,956,476 A | | 9/1999 | Ranson et al. |
| 5,956,477 A | | 9/1999 | Ranson et al. |
| 6,003,107 A | | 12/1999 | Ranson et al. |
| 6,009,539 A | | 12/1999 | Ranson |
| 6,041,371 A | * | 3/2000 | Provence .................... 710/58 |
| 6,377,912 B1 | | 4/2002 | Sample et al. |
| 6,389,558 B1 | | 5/2002 | Herrmann et al. |
| 6,397,354 B1 | | 5/2002 | Ertekin |
| 6,625,783 B2 | * | 9/2003 | Yamanaka .................. 716/3 |
| 6,732,311 B1 | | 5/2004 | Fischer et al. |
| 6,754,852 B2 | * | 6/2004 | Swoboda .................... 714/39 |
| 6,873,183 B1 | * | 3/2005 | Kaviani et al. ............. 326/46 |

(Continued)

OTHER PUBLICATIONS

Agilent Technologies, "Triggering a Logic Analyzer on Complex Computer Buses", The International Engineering Consortium, (date unknown), pp. 1-17, http://www.iec.org.

*Primary Examiner*—Rexford Barnie
*Assistant Examiner*—Dylan White

(57) ABSTRACT

One disclosed embodiment may comprise an application specific integrated circuit (ASIC). The ASIC includes memory that stores condition data defining conditions for enabling transitions among a plurality of states and next state data defining a next state associated with each of the respective conditions. A state machine circuit employs the condition data and the next state data to transition from a current state of the state machine circuit to a next state as a function of applying at least one condition relative to input data. The at least one condition is defined by condition data that is associated with the current state. The state machine circuit associates next state data with the at least one condition based on the current state of the state machine circuit. A control circuit provides a trigger signal in response to the current state of the state machine circuit transitioning to at least one predefined state of the plurality of states.

35 Claims, 8 Drawing Sheets

U.S. PATENT DOCUMENTS

| | | |
|---|---|---|
| 6,917,220 B2 * | 7/2005 | Saito .......................... 326/46 |
| 7,061,272 B2 * | 6/2006 | Wilkes et al. ................. 326/46 |
| 7,159,083 B2 * | 1/2007 | Samuel et al. ............. 711/156 |
| 7,228,472 B2 * | 6/2007 | Johnson et al. ............. 714/724 |
| 2003/0126508 A1 | 7/2003 | Litt |
| 2004/0124903 A1 | 7/2004 | Chaudhari |
| 2004/0193962 A1 | 9/2004 | Johnson et al. |
| 2004/0193976 A1 | 9/2004 | Slaight et al. |
| 2005/0140390 A1 * | 6/2005 | Wilkes et al. ................. 326/46 |

* cited by examiner

SYSTEM AND METHOD FOR GENERATING A TRIGGER SIGNAL

CROSS REFERENCE TO RELATED APPLICATIONS

This application is related to the following commonly assigned co-pending patent applications: U.S. patent application Ser. No. 11/032,743 entitled "SYSTEM AND METHOD FOR DATA ANALYSIS"; U.S. patent application Ser. No. 11/033,226 entitled "SYSTEM AND METHOD TO QUALIFY DATA CAPTURE"; U.S. patent application Ser. No. 11/032,928 entitled "SYSTEM AND METHOD TO CONTROL DATA CAPTURE", all of which are filed contemporaneously herewith on Jan. 11, 2005, and are incorporated herein by reference.

BACKGROUND

As higher levels of circuit integration are achieved on a single integrated circuit chip or a chipset, there tends to be an increased complexity associated with internal operation of a chip or associated with internal operation of the chipset. Various types of systems, internal and external, have been developed to facilitate monitoring and/or analyzing operation of a chip or a chipset. As an example, a logic analyzer is one device that can assist some aspects of monitoring and analyzing operation.

DETAILED DESCRIPTION

Figure 1:
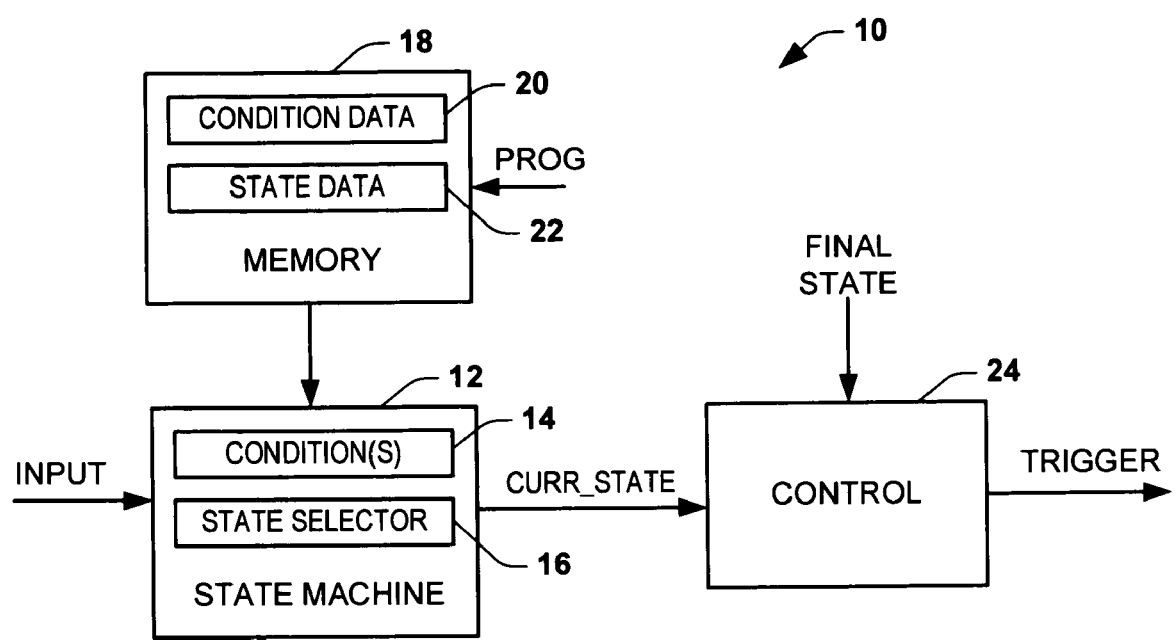
FIG. 1 depicts an embodiment of a system to generate a trigger signal.

FIG. 1 depicts an example of a system 10 that can be employed to generate TRIGGER signal sampling (or capture) of data from an associated data source (e.g., a data bus). The TRIGGER signal can be utilized to invoke or initiate any other operation or process (e.g., fault monitoring and data analysis and the like). The system 10 can be implemented as an application specific integrated circuit (ASIC), such as may be employed in a computer system, a router or other type of system that may process or propagate data.

The system 10 includes a state machine circuit 12 that includes a plurality of states. The state machine 12 includes one or more conditions 14 that control transitions from a current state to a next state based on an INPUT relative to the one or more conditions. The INPUT can correspond to one or more input signals or bits of data. As used herein, the terms "data" and "signal" in singular or plural forms are used interchangeably to identify one or more units of information (e.g., one or more bits).

The one or more conditions 14 can include any type of one or more components, including discrete logic, combinational logic, registers, comparators or other circuit components that determine whether one or more predefined conditions or events occur based on the INPUT. For instance, the one or more conditions 14 can implement a combination of one or more of arithmetic functions, logic functions, and matching functions relative to the INPUT. The one or more conditions 14 further can vary (e.g., be programmed to vary) depending on the current state of the state machine 12. When more than one condition exists for a current state, the conditions may correspond to separate conditional branches of the state machine 12 for transitioning from the current state to a respective next available state based on the results of each the conditional branches as applied to the INPUT.

A state selector 16 selects the next state for the state machine 12 based on the results of the one or more conditions 14 applied to the INPUT. Any number of one or more conditions 14 can be associated with each of the plurality of states. When more than one condition 14 is applied to the INPUT data for the current state, the state selector 16 selects the next state for the state machine according to results from a selected one of the associated conditions. Various schemes can be utilized to select which next state will be utilized. As an example, a hierarchy can be assigned to set a priority among each of conditions for the current state (e.g., corresponding to a priority encoder).

Additionally or alternatively, the state machine 12 can be programmed to require more than one occurrence of a given one or more condition 14 before enabling a transition to the next state for such condition(s). For example, the state machine 12 can include circuitry for counting or accumulating each instance when the one or more conditions 14 have been satisfied. The state machine 12 can also implement a transition from the current state to the corresponding next state up to a rate that is substantially commensurate with a clock cycle for the system 10. The transition rate will tend to vary depending on a frequency domain for the INPUT. For example, if the INPUT is provided at a frequency that is slower than the clock (e.g., a system clock for the ASIC in which the system is implemented) of the system 10, synchronizing circuitry in the state machine 12 can synchronize the INPUT to the clock signal, such as by adding "dummy" data that separates actual data for analysis.

The system 10 also includes memory 18 that stores data for configuring the state machine 12. The memory 18 can store condition data 20 to program the one or more conditions 14 that the state machine 12 applies to the INPUT. The one or more conditions (e.g., circuitry) of the state machine 12 can be communicatively coupled with the memory 18 for reading condition data for the current state. The memory 18 can also store next state data 22 that defines a next state for each of the respective conditions implemented for the current state. The state machine 12 associates (e.g., by reading corresponding next state data from the memory 18) the next state with the one or more conditions 14 based on the current state of the state machine. As mentioned above, the next state for each of the one or more conditions 14 that is applied by the state machine 12 can vary according to the current state. The condition data 20 and the state data 22 can be programmable, via a program signal indicated at PROG, to define the respective conditions available state transitions associated with each of the one or more conditions 14 of the state machine 12. The memory 18 can be implemented as a register array or other addressable memory.

The state machine 12 provides an indication of the current state, indicated at CURR_STATE, to a control block 24. The control block 24 provides a TRIGGER signal in response to the current state of the state machine 12 transitioning to at least one predefined state of the plurality of states, indicated at FINAL STATE. The TRIGGER signal can be employed to trigger sampling of data from an associated data source. As an example, a data captures system, such as described herein, can employ the TRIGGER signal to store data from the data source (e.g., a bus). The INPUT can further vary as a function of the data that is stored in response to the TRIGGER signal. The TRIGGER signal can also be utilized to initiate another function or process (e.g., hardware or software) within the system 10 or external to the system.

Figure 2:
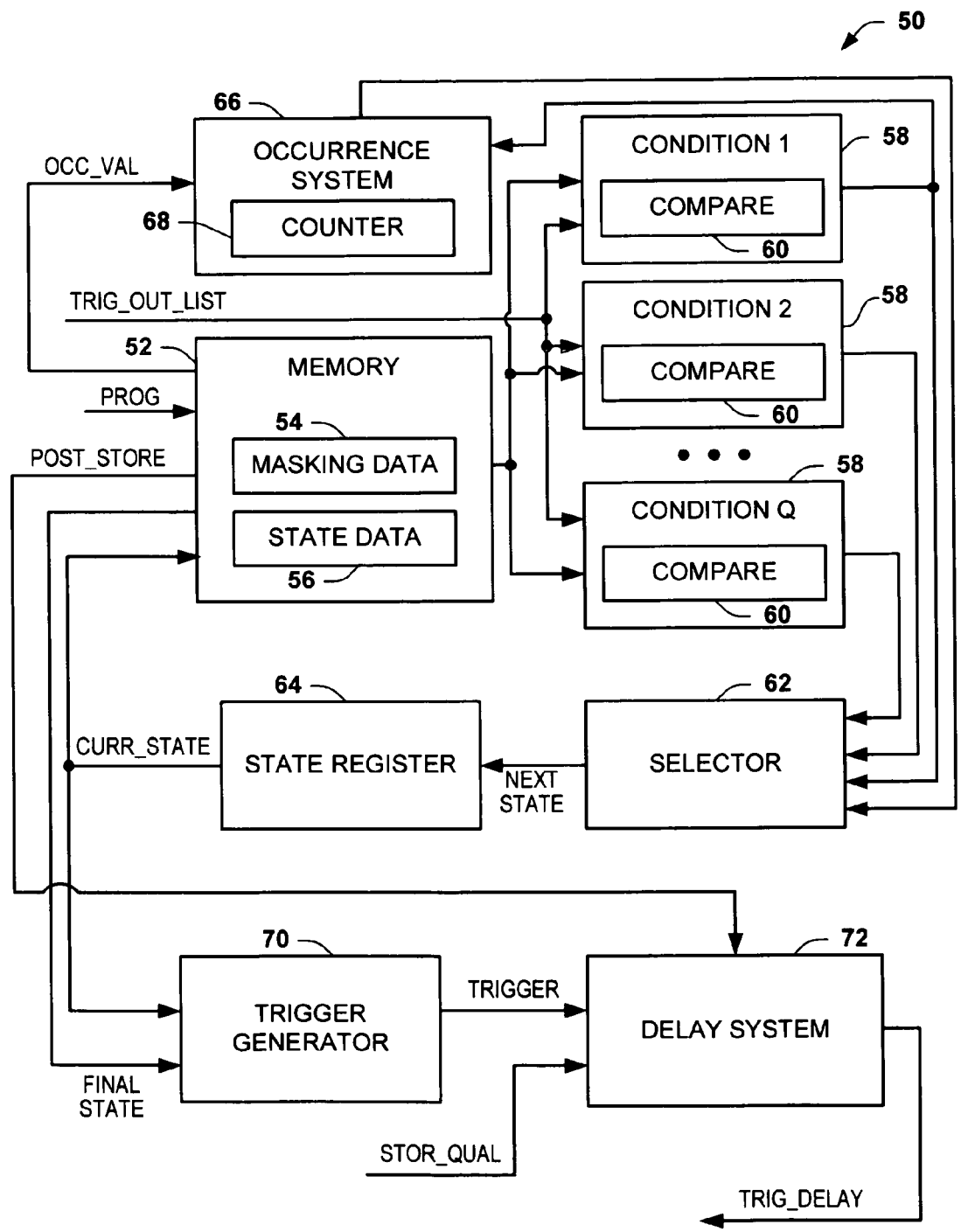
FIG. 2 depicts an embodiment of another system to generate a trigger signal.

FIG. 2 depicts an example of a state machine system 50 that can be utilized for logically analyzing data provided on a bus, such as a multi-bit synchronous observability or debug bus. The analysis system 50 employs a memory 52 that stores a vector, which can include masking data 54 that defines one or more conditions for implementing a state machine. The memory 52 can also include state data 56 that defines states and transitions among the available states. For example, the memory 52 can be any type of system addressable memory (e.g., a register array, such as a CSR) that can be written to, such as from a system processor of a computer system in which the analysis system 50 is implemented. Other tools and interfaces can also be utilized to program the memory 52. The memory 52 can also be read from to drive state transitions of the state machine.

The analysis systems 50 implements a state machine that transitions among a plurality of available states based on one or more input signals TRIG_OUT_LIST, which describes performance characteristics of the data on the bus. Those skilled in the art will understand and appreciate various ways in which the analysis system 50 can be implemented to analyze the information provided in the TRIG_OUT_LIST signals. The analysis system 50 can include one or more condition components 58 that control state transitions for the state machine from a current state (CURR_STATE) to a NEXT STATE. The CURR_STATE can include one or more bits (e.g., a three bit value) that determine how data propagated on the bus (e.g., the debug bus) will be analyzed and captured. The sequence of possible states, transitions between states, and functions perform by each condition component 58 can be programmed as a state transition vector in the memory 52 defined by the masking data 54 and the state data 56.

In the example of FIG. 2, the condition components 58 are represented as CONDITION 1, CONDITION 2 and CONDITION Q, where Q is a positive integer (Q≧1) denoting a number of conditional branches and functions that can be implemented for each state. Those skilled in the art will understand and appreciate various types and other numbers of condition components 58 can be utilized in the analysis system 50. The condition components 58, for example, correspond to conditional logic and conditional branches performed on the TRIG_OUT_LIST to control state transitions for the state machine. The condition components 58 employ compare blocks (e.g., comparator circuitry) 60 to implement their respective functions on the TRIG_OUT_LIST according to masking data 54 read from the memory 52.

As an example, the compare block 60 for each condition component 58 can implement bit-wise masking (or matching) relative to at least a portion of the performance condition data represented by the TRIG_OUT_LIST. The compare blocks 60 thus can implement matching each cycle based on a masking vector stored as the masking data 54. The vector in the masking data 54 can be different for each compare block 60. The masking data 54 further can be fixed for a given capture session or the masking data can vary over a capture session, such as by employing different masking vectors for some or all of the available states. When a masking vector for a given condition component 58 matches the TRIG_OUT_LIST for the current state, the condition component provides a corresponding output to a selector 62 indicating that the condition has been met (e.g., the vector is enabled).

The selector 62 is operative to identify the NEXT STATE for the state machine based on the outputs from the conditions components 58. The condition components 58 can be employed as hierarchical arrangement of elements that control state transitions. For example, the condition components 58 can function as a priority encoder that implements state transitions based on the CURR_STATE and based on the TRIG_OUT_LIST. As a priority encoder, the selector 62 can set the NEXT STATE based on which of the condition components is enabled according to the priority assigned to the respective condition components 58. Accordingly, the condition components 58 may operate as separate conditional branches that can be employed to implement predefined state transitions (e.g., preprogrammed as the state data 56) for the state machine based on comparing the TRIG_OUT_LIST relative to the corresponding masking data 54 associated with each condition branch.

The selector 62 provides the next state information to a state register 64. The state register 64 thus provides an indication of the current state as the CURR_STATE signal. As mentioned above, the CURR_STATE can be employed to select a next available state from the state data 56 as well as (optionally) redefine the masking vector to be applied be each of the condition components 58 for the current state. Since the TRIG_OUT_LIST can vary up to the rate of every clock cycle for the system 50, by implementing the condition components 58 and selector 62 as hardware (e.g., part of an ASIC), the state machine can implement a transition to the next state up to a rate of every clock cycle.

The system 50 can also include an occurrence system 66 that is operative to require multiple hits or occurrences by one or more given condition components 58 before enabling the selector 62 to transition to a next state for the given condition component. For purposes of explanation, the example of FIG. 2 assumes that the occurrence system 66 applies only to the CONDITION 1, although other occurrence requirements can also be utilized in conjunction with other conditional branches of the analysis system 50. The occurrence system 66 thus provides an occurrence enable signal to the selector 62 indicating whether the predefined number of occurrences has been met for the given condition component (e.g., CONDITION 1) 58. The selector 62 thus can select the next state assigned to CONDITION 1 only if, for example, the occurrence enable signal indicates the number of occurrences has been met.

As an example, the occurrence system 66 includes a counter 68 that is operative to count occurrences when the compare block 60 for CONDITION 1 indicates that the corresponding masking vector is met for the CURR_STATE. The memory 52 can provide an occurrence value (OCC_VAL) to the occurrence system 66. The value of OCC_VAL defines a number of one or more occurrences that are required before the masking data vector associated with CONDITION 1 can enable the selector 62 to load the next state vector associated with CONDITION 1. The same or different occurrence values can be programmed for different states of the state machine. The occurrence system 66 compares OCC_VAL relative to the value provided by the counter 68 and provides the occurrence enable signal to the selector 62 based on the comparison. The occurrence enable signal masks off the next state vector associated with CONDITION 1 until the OCC_VAL is met by the output of the counter 68. Accordingly, until the occurrence requirements associated with the CONDITION 1 have been met, the next state of the state machine will correspond to one of the next state vectors associated with one of the other condition components (CONDITION 2 or CONDITION Q) 58.

The analysis system 50 also includes a trigger generator 70. The trigger generator 70 is operative to generate the TRIGGER signal based on the CURR_STATE relative to a predefined FINAL STATE, which can be stored in the memory 52. The trigger generator 70 can also include additional logic to force the trigger generator to provide the TRIGGER signal under one or more predefined conditions. Those skilled in the art will understand and appreciate various ways in which a TRIGGER signal can be generated, such as based on desired performance characteristics and design requirements.

The system 50 also includes a delay system 72 that is operative to generate the TRIG_DELAY signal based on the TRIGGER signal and the STOR_QUAL signal. As an example, the delay system 72 can employ a counter that increments its value provided that the TRIG_DELAY signal is not asserted and both the STOR_QUAL and TRIGGER signals are asserted (e.g., corresponding to qualified trigger events). The counter can increment its value for each qualified store cycle after the trigger generator has asserted the TRIGGER signal. The delay system 72 thus can include comparator (or other circuitry—not shown) that compares the output of the counter relative to a predefined counter value, indicated at POST_STORE. The POST_STORE value can be a predefined value that is read from corresponding system addressable memory 52 for implementing a desired trigger delay. The POST_STORE value can be programmed, such as for a given capture session, to define a trigger delay value that sets a data capture point relative to a corresponding trigger event (e.g., when the TRIGGER signal is asserted).

For example, a corresponding data capture system can capture a set of data over any number of one or more store cycles relative to a trigger event based on the POST_STORE value (e.g., POST_STORE=0). The set of data can include past data prior to the trigger event or data that overlaps with a trigger event. Depending on the size of the counter, a POST_STORE value may also be set to store future data after the occurrence of a trigger event. For instance, future data can be stored by reading data from the data capture system and storing the data in memory over a plurality of cycles after the trigger event. The TRIG_DELAY signal thus can be provided to the data capture system along with the STOR_QUAL signal for controlling operation of the data capture system, such as described herein.

Figure 3:
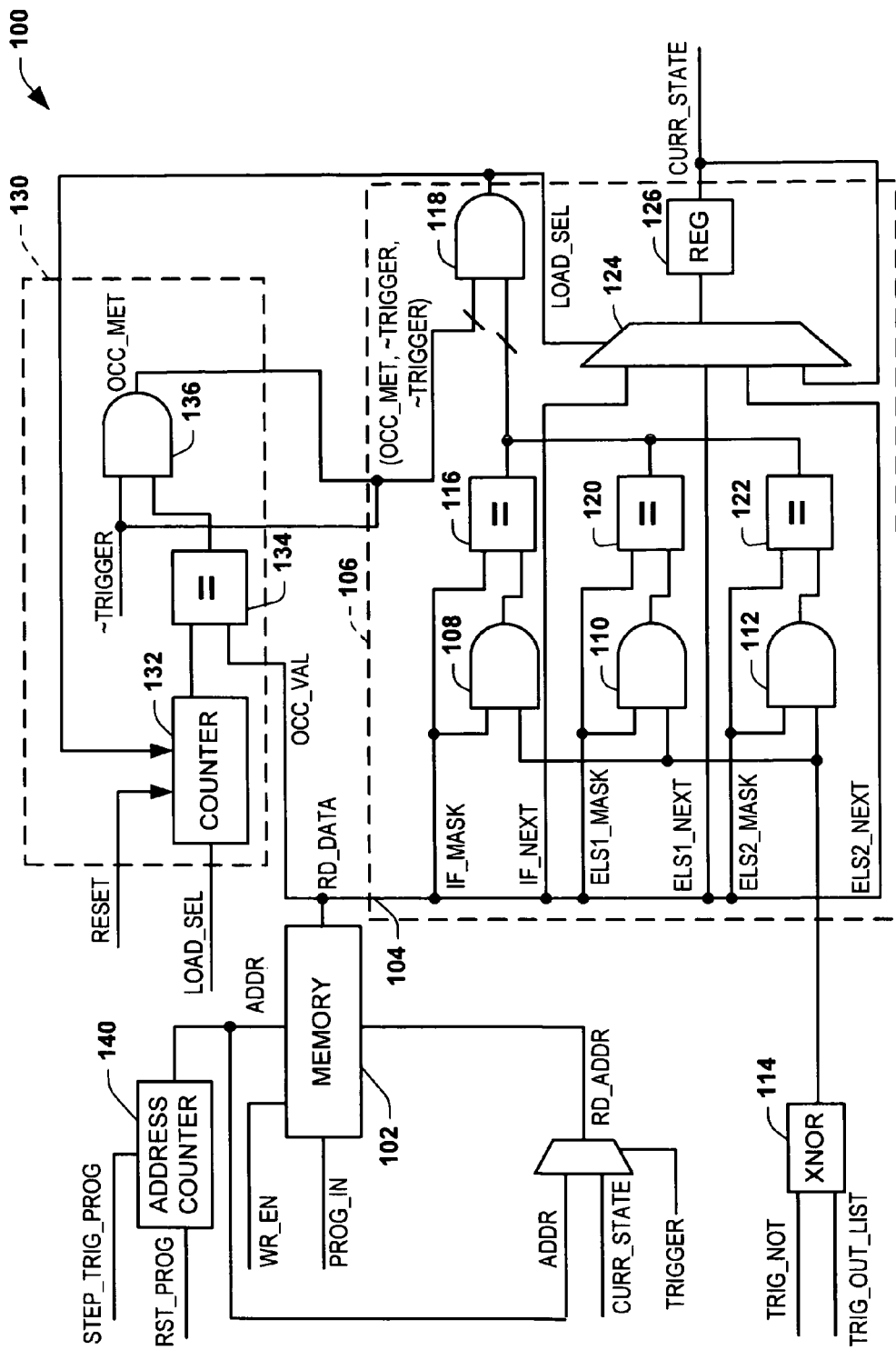
FIG. 3 depicts an embodiment of part of a system to generate a trigger signal.

FIG. 3 depicts an example of an analysis system 100 that can be utilized to control analysis of data provided on a bus, such as a multi-bit synchronous debug bus. The analysis system 100 includes addressable memory 102 that can be written to store a vector that defines a plurality of states as well as conditions for implementing a state machine circuit 106 based on the TRIG_OUT_LIST. The analysis system 100 may include one or more conditional branches that define possible transitions for the state machine circuit 106.

The memory 102 provides data (RD_DATA) to a multi-bit bus 104, which RD_DATA controls operation of the state machine circuit 106. The memory 102 can be any type of system addressable memory (e.g., a register array) that can be written to, such as from a system processor of a computer system in which the analysis system 100 is implemented. The memory 102 can also be read from to drive the bus 104 with the RD_DATA.

By way of further example, the state machine circuit 106 employs a selected subrange of data from the bus 104 (e.g., as stored in the memory 102) to implement conditions that determine state transitions based on the TRIG_OUT_LIST, such as described herein. The state machine circuit 106 provides an indication of a current state (CURR_STATE) based on which a TRIGGER signal and a trigger delay (TRIG_DELAY) signal can be generated (see, e.g., FIG. 4). The CURR_STATE can include one or more bits (e.g., a three bit signal) that, for example, determine how data propagated on an associated bus (e.g., a debug bus) will be captured and analyzed.

Those skilled in the art will understand and appreciate various ways in which the state machine circuit 106 can be implemented to analyze the performance information provided in the TRIG_OUT_LIST signals. The state machine circuit 106, for example, can employ conditional logic with plural conditional branches to implement corresponding state transitions for the state machine. The sequence of possible states, transitions between states, and actions to perform in a given state can be programmed as a state transition vector in the memory 102 and be read from the bus 104. The state machine circuit 106 is operative to implement state transitions based on the data contained in the TRIG_OUT_LIST signals according to the CURR_STATE of the state machine.

In the example of FIG. 3, the state machine circuit 106 includes a plurality of conditional branches each implementing a respective condition for transitioning between states based on applying masking data from the bus relative to the TRIG_OUT_LIST data. Each of the branches includes an AND-gate 108, 110 and 112 that ANDs together masking data from the bus 104 (e.g., a vector programmed in the memory 102) relative to an output of an XNOR-gate 114. The XNOR-gate 114 operates as a bitwise inverter by performing an exclusive NOR function between the bits of data associated with the TRIG_OUT_LIST signals and a programmable TRIG_NOT signal. The XNOR-gate 114 thus provides a corresponding multi-bit output to an input of the respective AND-gates 108, 110 and 112 corresponding to a bit-wise inverted version of the TRIG_OUT_LIST data.

A multi-bit IF_MASK vector from the bus 104 is provided to another input of the AND-gate 108 and to the input of a bit-wise comparator 116. The output of the AND-gate 108 is provided to another input of the comparator 116. The combination of the AND-gate 108 and comparator 116 thus determines whether the IF_MASK vector has been enabled based on the TRIG_OUT_LIST data. For example, when the IF_MASK vector is enabled by the output of the XNOR-gate 114 (e.g., corresponding to one or more bits of the TRIG_OUT_LIST), the comparator 116 output is asserted for loading an IF_NEXT vector from the bus 104. The output of the comparator 116 thus corresponds to one input bit of a multi-bit input of an AND-gate 118.

The state machine circuit 106 includes other conditional branches that can enable state transitions, such when the IF_MASK vector is not enabled by TRIG_OUT_LIST. In the example of FIG. 3, there are two other conditional branches controlled respectively by an ELS1_MASK vector and an ELS2_MASK vector from the bus 104. The bus 104 provides the ELS1_MASK vector to an input of the AND-gate 110 to implement another masking condition relative to the output of the XNOR-gate 114 (e.g., corresponding to a bit-wise inversion of TRIG_OUT_LIST). The AND-gate 110 provides a multi-bit output to a comparator 120, which compares the output of the AND-gate 110 with the ELS1_MASK vector from the bus 104 to determine whether the corresponding mask defined by ELS1_MASK is enabled. The comparator 120 provides another load control signal to the AND-gate 118 for loading an ELS1_NEXT vector from the memory 102. The ELS1_NEXT vector defines a state transition from the CURR_STATE to the state defined by the ELS1_NEXT vector in the memory 102.

The ELS2_MASK vector can be employed to enable a state transition to a next state (ELS2_NEXT) that is associated another conditional branch in the state chain. For instance, the ELS2_MASK can operate to control a state transition when neither the IF_MASK vector nor the ELS1_MASK vector conditions have met. In the example of FIG. 3, the ELS2_MASK vector is provided to an input of the AND-gate 112 together with the output XNOR-gate 114. The AND-gate 112 performs a bit-wise-AND function to drive a multi-bit input of a comparator 122. The comparator performs a bit-wise comparison between the output of the AND-gate 112 and the ELS2_MASK vector. The comparator 122 drives another bit of the multi-bit input to the AND-gate 118 for loading an associated ELS2_NEXT vector from the bus 104. That is, when the ELS2_MASK vector is enabled based on the TRIG_OUT_LIST, the masking system can transition to another condition branch of the state chain defined by the ELS2_NEXT vector.

By way of further example, the following TABLE I provides a truth table representation of possible state transitions that can be implemented by the state machine circuit 106 of the state machine 100 based on the outputs of the respective comparators 116, 120, and 122. The entries in TABLE I thus correspond to the outputs of the conditional branches of the state machine 100 provided by the comparators 116, 120 and 122. For instance, BRANCH 1 (AND-gate 108 and comparator 116) corresponds to a first or highest priority condition (e.g., an "if" condition), BRANCH 2 (AND-gate 110 and comparator 120) corresponds to a next highest priority condition (e.g., an "else if" condition) and BRACH 3 (AND-gate 112 and comparator 122) corresponds to a lowest priority condition (e.g., another "else if" condition). The values of the outputs for each of the respective, namely whether the respective vectors are enabled (denoted by a logic "1") or are disabled (denoted by a logic "0"). In TABLE I, the letter "X" denotes a "don't care" state associated with the respective outputs of comparators 120 and 122.

The values of the outputs for each of the respective comparators 116, 120 and 122 indicates whether the respective vectors (stored in the masking memory 102) are enabled (denoted by a logic "1") or are disabled (denoted by a logic "0"). The results provided further assume that any defined occurrence value for the condition defined by IF_MASK has been met prior to implementing the results or state transition for the associated branch. The results of the TABLE I thus define a priority encoder that can be employed to load state data according to a predefined hierarchy and which of the conditional branches is enabled or disabled. When none of the conditions are met (e.g., all conditions equal 0), the multiplexer 124 maintains its current state. Those skilled in the art will understand and appreciate various ways in which the functionality similar to that demonstrated in TABLE I can be realized to implement a state machine within a computer system, including hardware and/or software, based on the teachings contained herein.

TABLE I

| BRANCH 1 | BRANCH 2 | BRANCH 3 | RESULT |
|---|---|---|---|
| 0 | 0 | 0 | Load CURR_STATE |
| 0 | 0 | 1 | Load ELS1_NEXT state |
| 0 | 1 | X | Load ELS2_NEXT state |
| 1 | X | X | Load IF_NEXT state |

In the example of FIG. 3, the AND-gate 118 provides a multi-bit control input (LOAD_SEL) signal to the multiplexer 124 based at least in part on the outputs of the comparators 116, 118 and 120. The multiplexer 124 receives as its inputs the IF_NEXT vector, the ELS1_NEXT vector and the ELS2_NEXT vector as well as a current state (CURR_STATE) signal which is fed back from an output of an output register 126. The multiplexer 124 loads the output register 126 with a selected one of the inputs (IF_NEXT, ELS1_NEXT, ELS2_NEXT, CURR_STATE) based on the LOAD_SEL signal to provide a multi-bit (e.g., three bit output) signal to the register 126 that defines the state CURR_STATE of the system 100. That is, when the conditions associated with the IF_MASK are met, the AND-gate 118 provides a load select signal for loading the IF_NEXT vector to set the next state. Similarly, if the IF_MASK condition is not met and the ELS1_MASK is met, the AND-gate 118 can provide the LOAD_SEL signal to select the ELS1_NEXT vector corresponding to a transition to another state of the state machine. Additionally, when neither the IF_MASK nor the ELS1_MASK conditions are met and the ELS2_MASK condition is met the output of the comparator 122 is utilized by the AND-gate 118 to provide the LOAD_SEL signal to control the multiplexer 124 for selecting the ELS2_NEXT vector. When none of the conditions are met, the LOAD_SEL signal can maintain its current state based upon the current state that is fed back as an input to the multiplexer 124. These conditional transitions are demonstrated above in TABLE I.

The system 100 can also include an occurrence system 130 that is operative to require multiple hits or occurrences of a given conditional branch (e.g., the IF_MASK) associated to enable transition to a next state. The example of FIG. 3 assumes that the occurrence system 130 applies only to the IF_MASK vector, although other occurrence requirements can also be utilized in conjunction with other conditional branches or a combination of branches of the state machine circuit 106. Additionally, while the state machine circuit 106 is depicted as including three conditional branches, those skilled in the art will understand and appreciate various other types of branches and other numbers of branches can be utilized in the state machine circuit 106.

The occurrence system 130 includes a counter 132 that is operative to count occurrences when the condition associated with the IF_MASK vector is met for the current state. The memory 102 can provide an occurrence value (OCC_VAL) to a comparator 134 via the bus 104. The value of OCC_VAL defines a number of one or more occurrences that are required before the IF_MASK vector can enable the AND-gate to load the IF_NEXT vector. The same or different occurrence values can be programmed for different states of the state machine. The comparator 134 compares OCC_VAL relative to the counter value provided by the counter 132. The comparator 134 drives an input of an AND-gate 136 based on the comparison. The AND-gate 136

ANDs an inverted TRIGGER (~TRIGGER) signal relative to the comparator output to provide an output signal indicative of whether the number of occurrences has been met, indicated at OCC_MET.

The AND-gate 118 thus ANDs a multi-bit input, which includes OCC_MET and two inverted TRIGGER signals relative to the respective outputs of the comparators 116, 120 and 122 for controlling the multiplexer 124. Accordingly, when the occurrence requirements for the IF_MASK vector have not been met (e.g., the counter value is less than OCC_VAL) and the TRIGGER signal has not been asserted, the AND-gate 118 reverts based on application of the ELS1_MASK vector and the ELS2_MASK vector for the CURR_STATE. That is, OCC_MET masks off the IF_N-EXT vector until the OCC_VAL is met by the output of the counter 132. Stated differently, until the occurrence requirements associated with the IF_MASK vector have been met, the next state of the state machine will correspond to one of the ELS1_NEXT vector, the ELS2_NEXT vector and the CURR_STATE.

As mentioned above, the memory 102 that contains the vector for the state transitions can be programmable based upon programmable input data, indicated at PROG_IN. For example, the memory 102 can be implemented as system addressable memory (e.g., a register array) that can be programmed as addressable memory by a system processor of the computer system in which the system 100 is implemented or by other internal or external tools via associated interfaces. An address counter 140 is operative to provide a write address (ADDR) signal to write selected entries in the memory 102 with data from the PROG_IN input. The ADDR can be a multi-bit signal that defines an address in the memory 102. A write enable input (WR_EN) is also provided to the memory 102 to enable writing to the specified entry. The address counter 140 can be enabled by a reset program (RST_PROG) input to the address counter. The address counter 140 can be controlled to increment the count in a step size for accessing a desired entry in the memory 102 based upon a STEP_TRIG_PROG input. Each of the STEP_TRIG_PROG, RST_PROG and WR_EN inputs can be provided via system addressable memory, such as by a processor or other desire or interface that is capable of accessing such memory 102.

During normal operation, data (RD_DATA) can be read from the memory 102 via the bus 104 based upon a read address input signal, indicated at RD_ADDR. The RD_ADDR input is provided to a multiplexer 142 corresponding to a selected one of the CURR_STATE of the state machine and the address ADDR provided by the address counter 140. The multiplexer 142 selects the read address based on the TRIGGER signal so that transition information associated with the current state when a trigger event occurs can be provided at the read data bus 104.

Figure 4:
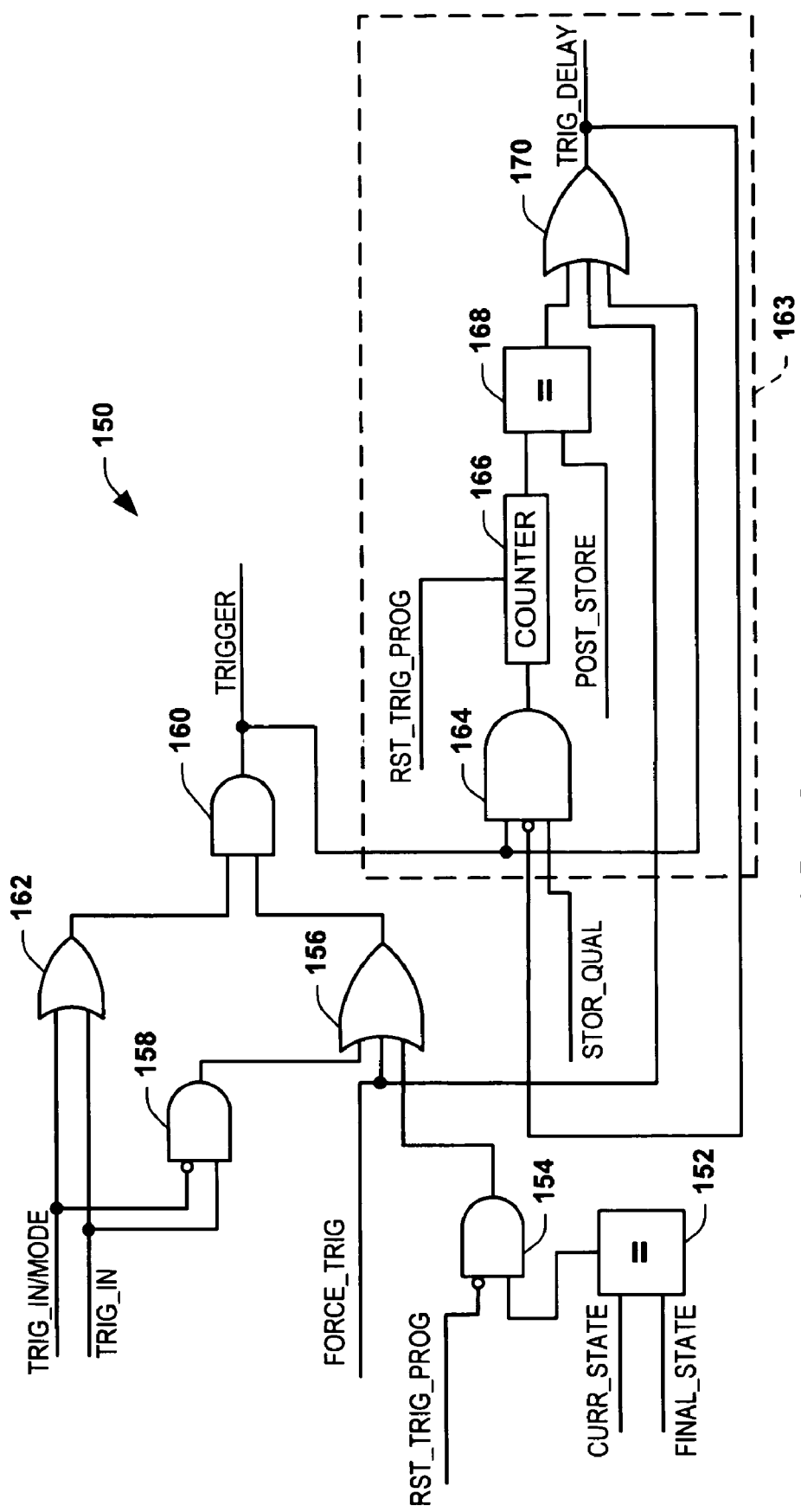
FIG. 4 depicts an embodiment of another part of a system to generate a trigger signal.

FIG. 4 depicts an example of trigger generator 150 that can be utilized in conjunction with the analysis system 100 shown and described in FIG. 3. The trigger generator 150 is operative to provide the TRIGGER signal and a trigger delay signal (TRIG_DELAY). The system 150 provides the TRIGGER signal based on trigger logic that evaluates the states of a variety of signals. The trigger logic, for example, can include a comparator 152 that compares the CURR_STATE relative to a predefined FINAL_STATE signal. The comparator 152 drives an input of an AND-gate 154 that ANDs the comparator output with an inverted version of a reset trigger program (RST_TRIG_PROG) signal, which may be a user programmable signal stored in system addressable memory. The AND-gate 154 in turn drives an input of an OR-gate 156.

The OR-gate 156 can also receive a force trigger (FORCE_TRIG) input signal that can be utilized to force an assertion on the TRIGGER signal by the system 150. Another AND-gate 158 ANDs an inverted TRIG_IN/MODE signal with a trigger in (TRIG_IN) signal to drive another input of the OR-gate 156. The OR-gate 156 drives an AND-gate 160 based on the respective inputs provided to the OR-gate. Additionally, the TRIG_IN/MODE signal and the TRIG_IN signal are provided to another OR-gate 162 that performs a logic OR function to provide a respective output to another input of the AND-gate 160. The AND-gate 160 thus generates the TRIGGER signal based on the outputs of the OR-gates 156 and 162. Those skilled in the art will understand and appreciate various ways in which a TRIGGER signal can be generated, such as based on desired performance characteristics and design requirements.

The system 150 also includes a trigger delay generator 163 that is operative to generate the TRIG_DELAY signal based on the TRIGGER signal, a STOR_QUAL signal and an inverted version of the TRIG_DELAY signal. As an example, the trigger delay generator 163 includes an AND-gate 164 that ANDs the TRIGGER signal, an inverted version of the TRIG_DELAY signal and the STOR_QUAL signal. The AND-gate 164 drives a counter 166 that is enabled based on the output of the AND-gate 164. The counter 166 thus increments its value provided that the TRIG_DELAY signal is not asserted and both the STOR_QUAL and TRIGGER signals are asserted (e.g., corresponding to qualified trigger events). The counter 166 can be reset via a RST_TRIG_PROG signal, which may be written to system addressable memory such as by a processor or other utility. A comparator 168 compares the output of the counter 166 relative to a predefined counter value, indicated at POST_STORE. The POST_STORE value can be a predefined value that is written to corresponding system addressable memory for implementing a desired trigger delay.

The POST_STORE can be programmed (e.g., in memory 102 of FIG. 3) to define a trigger delay value that sets a data capture point relative to a corresponding trigger event (e.g., when the TRIGGER signal is asserted). For example, a corresponding capture buffer of a logic analysis system can capture a set of data that can be stored in the capture buffer prior to a trigger event based on a minimum POST_STORE value (e.g., POST_STORE =0). In such a scenario, the capture buffer would turn off and stop storing data from the bus at a trigger event. Alternatively, the POST_STORE value can set the trigger delay to cause the capture buffer to store all data after a trigger event based on a maximum POST_STORE value corresponding to the size of the capture buffer. In this latter scenario, the capture buffer would fill the capture buffer with data from the debug bus after a trigger event.

Another alternative is to store a set of data based on the POST_STORE value in a capture window that resides anywhere in between the two capture scenarios mentioned above. The comparator 168 drives an input of an OR-gate 170. Other inputs to the OR-gate 170 include the TRIGGER signal and the FORCE_TRIG signal. The OR-gate 170 thus generates the TRIG_DELAY signal based on the output of the comparator 168, the FORCE_TRIG signal, and the TRIGGER signal. The TRIG_DELAY signal can be provided to the capture buffer along with the STOR_QUAL signal for controlling operation of the capture buffer, such as described herein.

Figure 5:
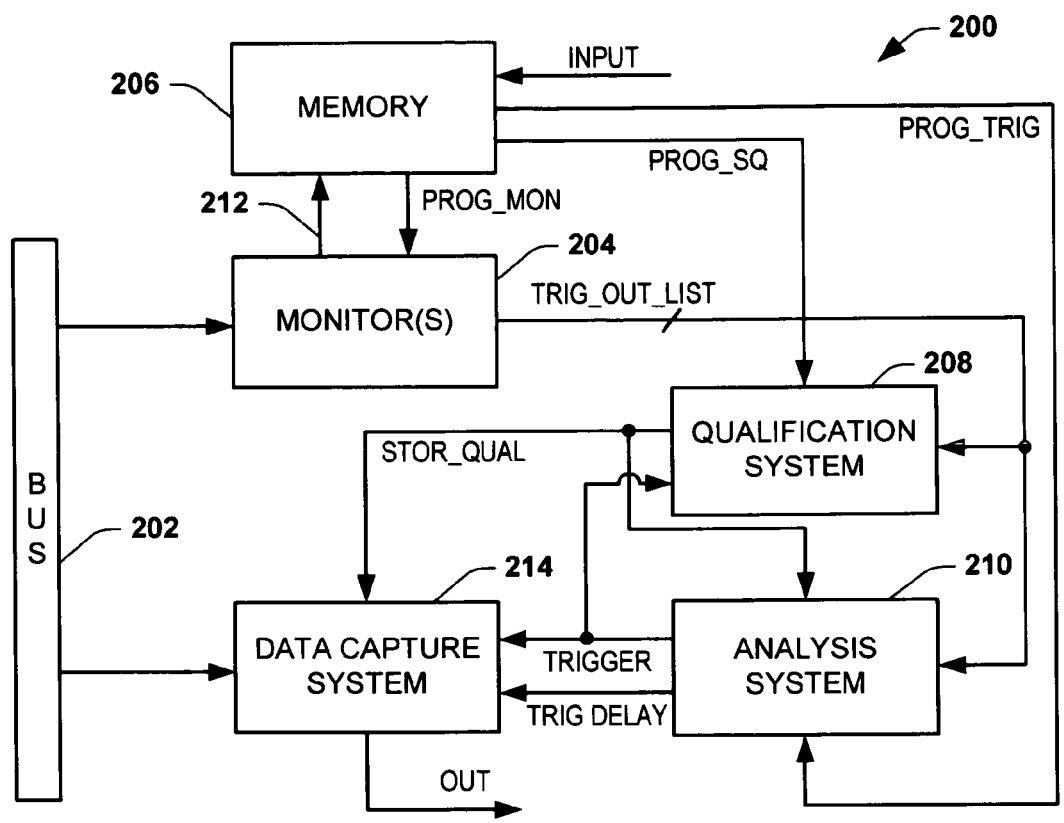
FIG. 5 depicts an embodiment of a logic analyzer.

FIG. 5 depicts an example of a logic analyzer system 200. The system 200 is utilized to acquire data from a data bus 202. The data bus 202, for example, can receive data from one or more sources in an integrated circuit chip or from anywhere in an associated device in which the system 200 is implemented. Those skilled in the art will understand and appreciate various approaches and feed structures that can be utilized to drive the bus 202 with data. The data bus 202, for example, can operate as a synchronous bus structure configured to propagate multi-bit data from one or more predetermined locations in an integrated circuit in which the system 200 is implemented. In a multi-processor, multi-cell computer system, for example, the bus 202 can also receive data from other integrated circuits as wells as from other circuit boards, such as provided via a crossbar structure.

A monitoring system 204 receives and monitors data provided on the bus 202. The monitoring system 204 can include a plurality of performance monitors/counters programmed and/or configured to determine whether certain performance conditions have been met based on the data propagated on the bus 202. For instance, the monitoring system 204 can be configured to implement arithmetic operations, logic operations, and matching operations, as well as combinations thereof relative to a subset of the data on the bus 202. The monitoring system 204 can provide a corresponding multi-bit output (TRIG_OUT_LIST) that indicates the results of each performance condition being monitored. The monitoring system 204, for example, can assert a corresponding output bit in the TRIG_OUT_LIST signal for each clock cycle that a given condition for a predetermined subset of some or all of the data bus 202 is met. Each bit in the TRIG_OUT_LIST, for example, can be asserted in response to a corresponding performance counter of the monitoring system increasing in value for a given clock cycle.

The performance conditions can be programmable and defined by writing to an associated memory 206. The associated memory 206 can be one or more system addressable memory blocks within the computer system (e.g., an array of control and status registers (CSRs)) that is programmable by one or more program (INPUT) signals. The INPUT signals can be employed to set desired logic, matching and/or arithmetic operations that are to be performed by the monitoring system 204 relative to the data on the bus 202. The memory 206 can provide (or the monitoring system 204 can read) PROG_MON signals to program the performance conditions for each performance condition monitored by the monitoring system 204. There can a separate block of the memory 206 associated with programming each performance condition that the monitoring system 204 is to evaluate. For example, corresponding blocks in the memory 206 may be programmed by an internal processor (e.g., via system addressable memory) or from an external device or system utility by writing to predetermined address locations in the memory 206 that are assigned to respective performance monitoring circuits of the monitoring system 204.

The monitoring system 204 provides the TRIG_OUT_LIST signals to a qualification system 208 and to an analysis system 210. The TRIG_OUT_LIST signals can be provided as data over a multi-bit bus that includes a respective output for each performance condition that is monitored by the monitoring system 204. For example, when a particular condition being implemented by the monitoring system 204 is met, a corresponding bit (or bits) in the TRIG_OUT_LIST signals can be asserted by the monitoring system 204 for a clock cycle. The assertion of the corresponding bit (or bits) in the TRIG_OUT_LIST signals can correspond to incrementing a corresponding counter or other tracking circuitry in a respective performance monitoring circuit of the monitoring system 204. Thus, the multi-bit output TRIG_OUT_LIST thus provides an indication as to whether certain conditions have been met in the data provided on the bus 202, and another signal 212 can provide a value associated with such performance over time. Those skilled in the art will understand and appreciate that the monitoring system 204 can be programmed and configured to monitor any number of one or more conditions associated with the data on the bus 202.

The qualification system 208 performs matching and qualification functions relative to the TRIG_OUT_LIST data provided by the monitoring system 204. The qualification system 208 provides a STOR_QUAL signal to an associated data capture system 214 to identify whether data should be captured from the data bus 202. The qualification system 208, for example, can be programmed via a PROG_SQ signal, such as to perform qualification logic or matching functions on a selected group or subgroups of the TRIG_OUT_LIST data relative to programmed data. The matching function, for example, can implement a matchable masking function that determines whether data should be captured from the data bus each clock cycle based on the results of the variables represented by the TRIG_OUT_LIST signals. The matching function can thus provide the STOR_QUAL signal to identify one or more patterns associated with the results of the performance conditions being monitored by the monitoring system 204.

The analysis system 210 is configured to provide a state machine that performs internal logic analysis for data on the bus based on performance information indicated by the TRIG_OUT_LIST data from the monitoring system 204. The analysis system 20 provides a TRIGGER signal and a trigger delay (TRIG_DELAY) signal to control a capture session for acquiring a set of data from the bus 202. For example, the analysis system 210 can be implemented as a state machine structure (e.g., Mealy or Moore) that transitions between states based on the performance conditions implemented by the monitoring system 204. As described herein, when the performance conditions are met, respective data in the TRIG_OUT_LIST can be asserted for a clock cycle to enable logic analysis to be performed by the analysis system 210. The analysis system 210 can provide the TRI_DELAY signal to the data capture system 214 based on the TRIG_OUT_LIST signals and the STOR_QUAL signal. The TRIGGER signal can also be provided to the qualification logic block 208, as mentioned above.

The analysis system 210 can be configured with a vector (PROG_TRIG) that defines a set of conditions to be applied by associated circuitry for analyzing the TRIG_OUT_LIST and of possible state transitions that can occur based on the conditions implemented. The analysis system 210 can also employ conditional branching with additional state transitions that can vary for each branch based on the TRIG_OUT_LIST data as well as based on the current state of the state machine implemented by the analysis system 210. Trigger events or conditions can occur when the analysis system 210 transitions into one or more of the programmable states of the analysis system, which state(s) is designed to cause the TRIGGER signal to assert.

For example, the state machine can include a FINAL STATE that causes the analysis system 210 to assert the TRIGGER signal. Additionally, a predetermined number of one or more occurrences of a given condition can be required before transitioning to a next state associated with the given condition. For instance, a value can be programmed (e.g., via the PROG_TRIG signal) to set a number of occurrences for a given condition associated with a least a portion (e.g., one or more) of the TRIG_OUT_LIST data that must be met to enable a transition to a next state for the given condition. Programmable means can also exist to force the analysis system 210 to assert the TRIGGER signal.

The analysis system 210 can also define a set of data relative to the occurrence of a predetermined event. In the example logic analysis system 200, the predetermined event corresponds to the TRIGGER signal being asserted, which can occur as the state machine transitions to a given one of its plurality of states. The analysis system 210 can count or track a number of qualified store cycles based on the STOR_QUAL signal relative to (e.g., before, after or overlapping with) the TRIGGER signal. The analysis system 210 in turn provides the TRIG_DELAY signal in response to counting or tracking the predetermined number of store cycles while enabled relative to assertion of the TRIGGER signal.

In a further example, the analysis system 210 can be programmed (e.g., via the PROG_TRIG signal) to adjust the timing of data capture relative to a trigger point, such as when the TRIGGER signal is asserted. For example, the timing can be programmed to define whether the capture buffer is to store data before the occurrence of a trigger event, after the occurrence of a trigger event or within some window that includes a trigger event. The window, for example, can vary based on the size of the one or more buffer employed by the data capture system 214 or other memory utilized in conjunction with the one or more buffers used to store the data from the bus 202.

The data capture system 214 is operative to store data from the bus 202 based at least in part on the STOR_QUAL signal from the qualification logic and based on the TRIGGER and TRIG_DELAY signal(s) provided by the analysis system 210. The data capture system 214 includes capture buffer control logic that can be set to define a quantity of data that is to be stored, a type of data that is to be stored and how data will be stored. For example, the control logic of the data capture system 214 can include an arrangement of hardware arranged to activate the data capture system 214 for reading and storing data from the bus 202 in response to the STOR_QUAL and TRIG_DELAY signals. The data capture system 214 can provide its corresponding output signal (OUT) to associated memory, such as system addressable memory, which can be read by a system processor.

Those skilled in the art will appreciate various types of memory structures (e.g., register arrays, buffers, RAM, cache and the like) that can be utilized for inputting program data to various parts of the system 200 and for storing output OUT data from the system 200. Additionally, the system 200, including the monitoring system 204, the qualification system 208, the analysis system 210 and the data capture system 214 (or at least portions thereof) can be implemented as part of an application specific integrated circuit (ASIC). The ASIC can be implemented as an integrated logic analyzer internal to a chipset, such as part of a computer system, a router, or other complex circuitry.

Figure 6:
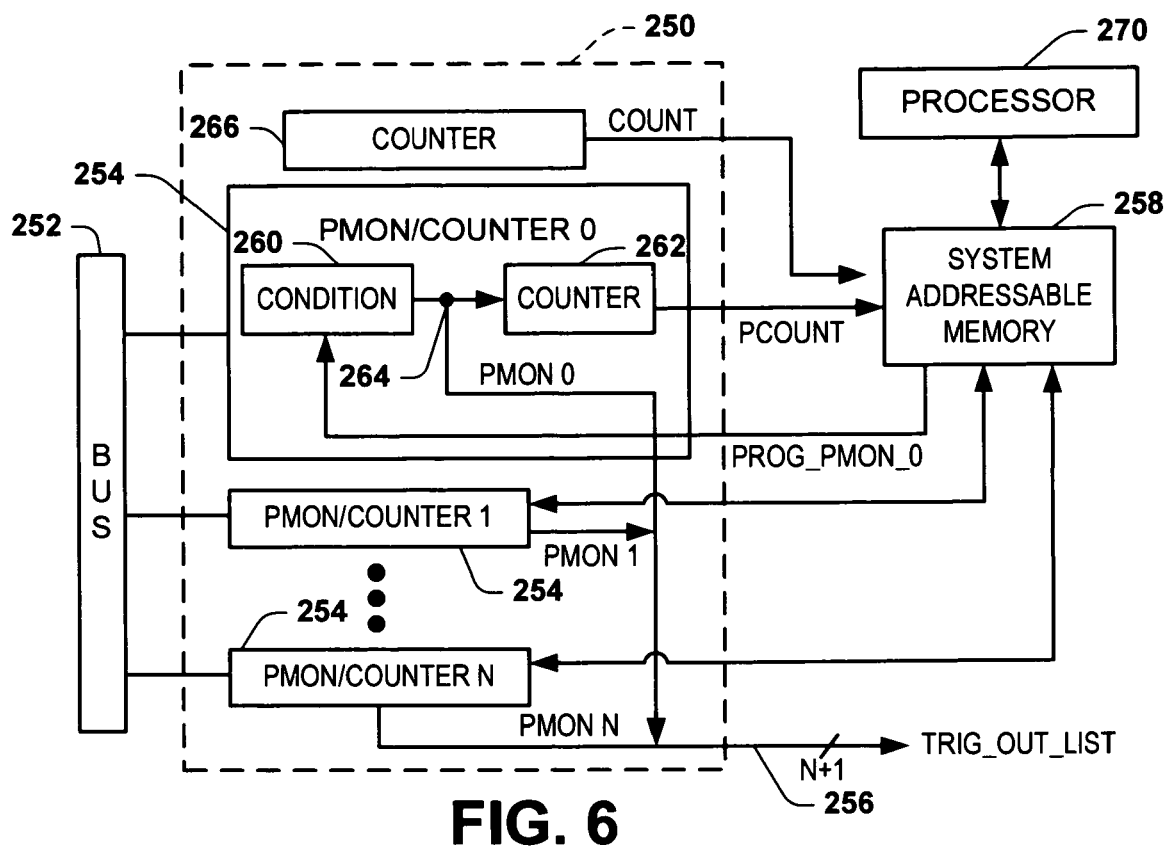
FIG. 6 depicts an embodiment of a monitoring system that can be utilized in conjunction with a system to generate a trigger signal.

FIG. 6 depicts an example of a performance monitoring system 250 that can be utilized to monitor performance characteristics associated with data on a bus 252, such as an observability bus. The performance monitoring system 250 can be implemented as part of a logic analyzer system implemented within an IC, such as forming part of a chip set for a computer system, a router or other electrical system. The performance monitoring system 250 includes a plurality of subsystems represented as performance monitor counters (PMON/COUNTER 0 and PMON/COUNTER 1 through PMON/COUNTER N) 254, where N is a positive integer and N+1 denotes the number of PMON/COUNTERS 254. The PMON/COUNTERS 254 collectively drive an output bus 256 corresponding to a multi-bit output signal indicated at TRIG_OUT_LIST. The output bus 256 thus can include N+1 bits, one bit associated with each of the PMON/COUNTERS 254.

Each of the PMON/COUNTERS 254 can be implemented as an arrangement of programmable logic, such as a programmable logic device (PLD), a field programmable gate array, other hardware, or as a combination of hardware and software. Each PMON/COUNTER 254 can be programmed to implement an operation or function for a selected portion or subrange of the data on the bus 252. For instance, each PMON/COUNTER 254 can implement a matching function relative to one or more selected bits from the bus 252. The PMON/COUNTERS 254 can also implement logic functions (e.g., invert, AND, OR, XOR, NOR, AND, XNOR and other logic functions and combinations of functions), arithmetic functions (e.g., addition, subtraction, multiplication, division, etc.), as well as combinations of logic and arithmetic functions on one or more bits on the bus 252.

System addressable memory 258 is operatively associated with each of the PMON/COUNTERS 254 to program a desired operation or function to be performed relative to data on the bus 252. The system addressable memory 258 can be accessed by a system processor 270 as well as by associated diagnostic utilities (not shown) or other devices that are capable of writing to the system addressable memory 258. The data in the system addressable memory 258 programs a particular operation or function that is performed by each of the respective PMON/COUNTERS 254.

In the example of FIG. 6, PMON/COUNTER 0 is depicted as including a condition block 260 and a counter 262. The condition block 260 implements a performance condition on one or more selected bits of data on the data bus 252, which condition can include performing an operation or function on the data, such as an arithmetic function, a logic function or a combination of logic and arithmetic functions. The particular logic and/or arithmetic function performed by the PMON/COUNTER 0 can be programmed according to a PROG_PMON_0 signal from the system addressable memory 258. The PROG_PMON_0 signal can also establish on which data from the bus 252 the performance condition is to be implemented, such as by identifying respective addresses for such data.

For example, the PROG_PMON_0 signal can include one or more bits that set the performance condition (e.g., logic function and/or arithmetic operation) that is performed on selected data from the bus 252. The condition block 260 provides a condition signal (PMON 0) 264 to the counter 262 based on application of the function or operation on the data. The condition block 260 can perform the performance condition every clock cycle or at other selected time intervals. When the performance condition is met, the condition block 260 asserts its output 264 (e.g., a logic HIGH for a clock cycle) corresponding to PMON 0, such as for one or more clock cycles. As an example, if the performance condition is met over a plurality of clock cycles, the condition block 260 may maintain PMON 0 in the asserted state over the plurality of clock cycles. Alternatively, the condition block 260 can toggle the PMON 0 output signal. The PMON 0 corresponds to part of the output bus 256 that forms the TRIG_OUT_LIST signals. Each bit in the TRIG_OUT_LIST can be asserted in response to increasing the value of a respective one of the PMON/COUNTERS 254 each clock cycle. The TRIG_OUT_LIST in turn can be employed to drive a trigger state machine, as described herein. As a result of the dual use of the PMON/COUNTERS 254 (e.g., driving respective performance counter values and driving a trigger state machine), an efficient use of hardware can be achieved.

The output condition signal PMON 0 can also adjust a measure of performance associated with the data being monitored by the condition block. In the example of FIG. 6, PMON 0 monitored increments (or decrements) the counter 262 according to whether the performance condition implemented by the condition block 260 is met in a given clock cycle. The counter 262 provides a PCOUNT signal having a value indicative of the measure of performance monitored by the respective performance monitoring subsystem. For example, the PCOUNT signal can have a value indicative of the number of times the performance condition implemented by the condition block 260 is met, such as during a given capture session or over a plurality of sessions. The counter 262 can be reset, if needed.

For purposes of simplicity of explanation, the internal contents of the other PMON/COUNTER 1 through PMON/COUNTER N have been omitted from FIG. 6, although it will be understood that each can be similarly configured as shown and described with respect to PMON/COUNTER 0. That is, each PMON/COUNTER 254 can be programmed and/or configured to perform respective performance conditions that drive associated counters based on whether the conditions are met. Each time a counter is incremented (or decremented) based on a performance condition, a corresponding PMON output from the respective PMON/COUNTER 254 is also asserted in the TRIG_OUT_LIST signals on the bus 256 (e.g., for a clock cycle). Each of the N bits on the bus 256 associated with the TRIG_OUT_LIST signals thus provides an indication of performance associated with a selected part of the data on the bus 252 according to the performance conditions implemented by condition blocks in each of the PMON/COUNTERS 254. While the PMON/COUNTERS 254 have been described as being programmable, it is also contemplated that one or more of the PMON/COUNTERS 254 can be hardwired to implement fixed performance monitoring conditions.

The system 250 can also include another general counter 266 that increments a counter value to provide a reference COUNT signal with each clock cycle (or on some other periodic interval). The value of the counter 266 thus can be compared or evaluated relative to the PCOUNT signal from the counter 262 (as well as to counters of the other PMON/COUNTERS 254) to ascertain an indication of the frequency that the respective performance conditions implemented by the condition block 260 (and other condition blocks of the other PMON/COUNTERS 254) are met. For example, the processor 270 can employ the counter while executing instructions corresponding to a diagnostic utility. The value of the counter 266 can also be employed to control operation of one or more of the PMON/COUNTERS 254.

Figure 7:
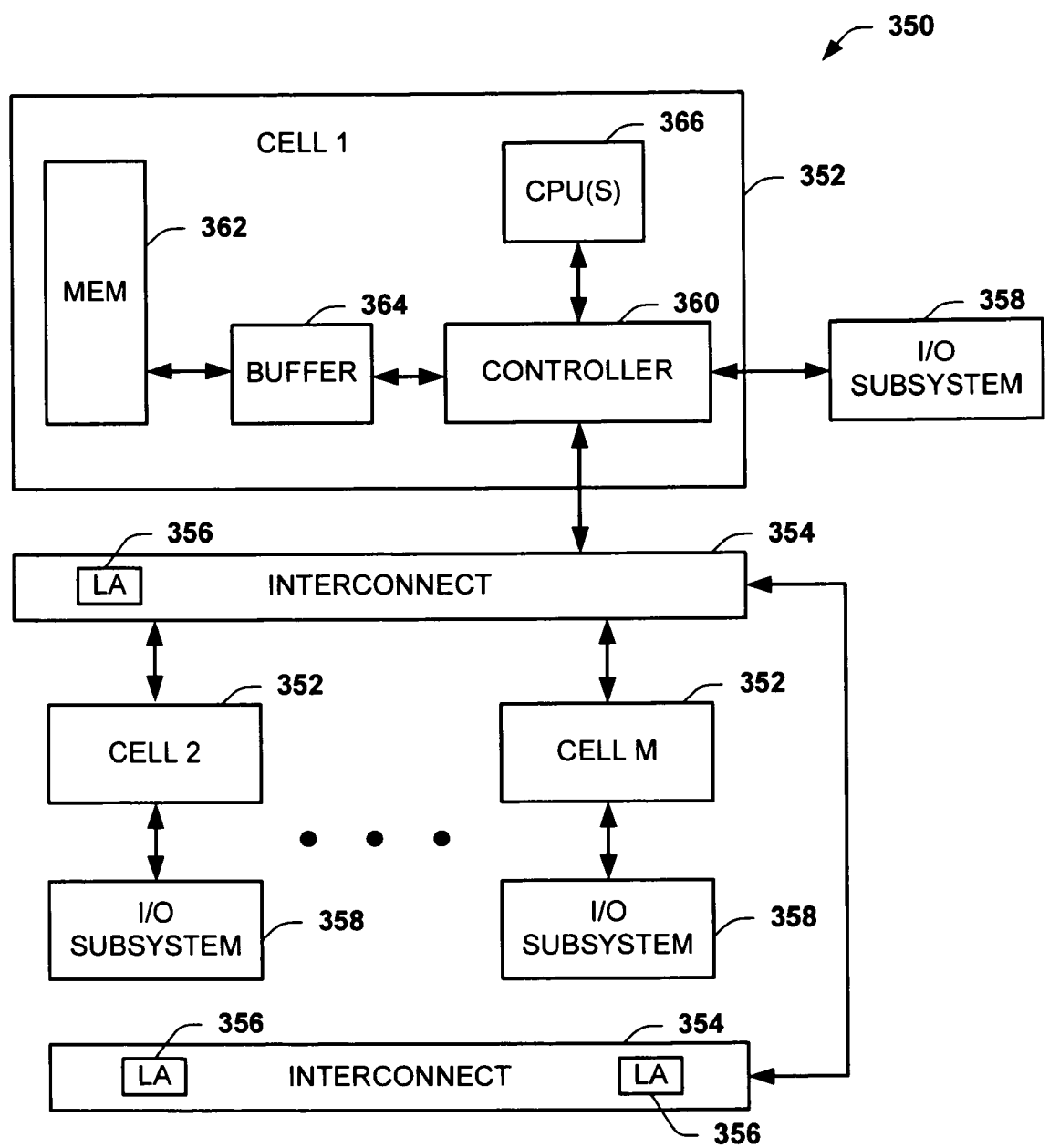
FIG. 7 depicts an example of a computer system that can implement one or more embodiments of a logic analysis system.

FIG. 7 depicts a block diagram illustrating an example of a computer system 350, which can implement one or more logic analyzer systems, such as including systems and components shown and described herein (e.g., FIGS. 1-6 and 8). The computer system 350 of FIG. 7 is depicted as a distributed-memory multi-processor system, although a single processor system can also utilize the logic analyzer. The system 350 includes a plurality of cells 352 indicated respectively at CELL 1, CELL 2 through CELL M, where M is an integer greater than or equal to one denoting the number of cells. Each of the cells 352, which can be implemented as a cell board, is communicatively coupled to other cells via an interconnect 354, such as a backplane or crossbar structure. The interconnects 354 can be implemented as an application specific integrated circuit (ASIC).

In the example of FIG. 7, one or more logic analyzers 356 are implemented within the interconnects 354; namely, one logic analyzer in a first interconnect and two logic analyzers in another interconnect. Those skilled in the art will understand and appreciate that any number of one or more logic analyzers can be implemented within the interconnects 354 as well as in other circuitry, including on integrated circuits in the cells 352 or I/O subsystems 358. By way of example, each logic analyzer 356 is coupled to a bus structure (e.g., an observability bus) within the respective interconnects 354 that can be driven with data from components within one or more cells 352. Additionally, as described herein, each logic analyzer 356 can include memory addressable within the system 350, which can be read from or written two by components on any of the associated cells 352.

By way of further example, an I/O (input/output) subsystem 358 is associated with each of the cells 352. The I/O subsystem 358 can provide an interface or pathway for accessing an associated bus structure (e.g., a PCI bus structure) or other devices coupled to the corresponding bus structure, such as through corresponding adapter (not shown). Those skilled in the art will understand and appreciate various types of I/O devices 358 that can be accessed or can access memory via the I/O subsystem 358.

Additionally, the interconnect 354 that contains one logic analyzer 356 can be coupled to the other interconnect, which contains two logic analyzers, for accessing another cell-based architecture that includes one or more other cells (not shown). The other cell-based architecture (not shown) can be similarly configured to that shown and described in FIG. 8. Those skilled in the art will understand and appreciate that the system 350, however, can be implemented with any number of cells, with any number of one or more logic analyzers being implemented.

For purposes of brevity, the internal contents are shown only for CELL 1, although those skilled in the art will understand and appreciate that each of the other respective cells 352 can be implemented in a similar manner. Alternatively, different configurations could also be implemented relative to the different cells 352.

Turning to the contents of CELL 1, CELL 1 includes a cell controller 360 coupled to a cell memory subsystem 362 through an associated buffer network 364. The buffer network 364 can include a queue (e.g., an input queue and an output queue) to provide intelligent buffering of requests and responses between the memory subsystem 362 and controller 360. One or more central processing units (CPUs) 366 are also connected to the controller 360 for accessing the memory subsystem 362. Each of the CPUs 366 can include an associated cache (not shown) for storing data for local access by the CPU without requiring access to the memory subsystem 362. In the arrangement shown in FIG. 8, the CPUs 366 and the I/O subsystem 356 each can be considered memory accessing devices operative to access data in the memory subsystem 362 via the controller 360. The controller 360 can include firmware, a configuration and status register (CSR) and an ordered access queue for accessing the data in the memory subsystem 362. The memory subsystem 362 can include any number of one or more memory modules, including one or more DIMM or SIMM memory devices.

When data is accessed by CPUs 366 and/or the I/O subsystem 356, the controller or other structures can drive selected portions or all of such data to the observability bus that is associated with one or more of the logic analyzers 356. The logic analyzers 356 can, in turn, monitor the data on the associated observability bus, qualify data based on the monitoring and capture data based on the qualification of the data. The logic analyzer further can implement a state machine that includes one or more conditions that control state transitions and how a given data capture session proceeds, such as described herein. In one example, the state machine may be implemented as hardware (e.g. an arrangement of gates or other circuitry) that can transition among a plurality of states a rate that is substantially commensurate with a system clock that drives integrated circuitry including the logic analyzer.

It will be further appreciated that a data capture session for one or more of the logic analyzers 356 can be initiated and controlled programmatically by computer executable instructions running in one or more of the CPUs 366. Alternatively or additionally, a capture session can be initiated and controlled by a utility or a diagnostic tool. The utility or diagnostic tools, for example, can run internally within a CPU 366 or externally as part of one of the I/O subsystems 358. Those skilled in the art will understand and appreciate various implementations of logic analyzers that can be employed in the computer system 350 based on the teachings contained herein.

In view of the foregoing structural and functional features described above, certain method will be better appreciated with reference to FIG. 10. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., logic gates, such as including transistors, a digital signal processor, or application specific integrated circuit), software (e.g., as executable instructions running on one or more processors), or any combination of hardware and software.

Figure 8:
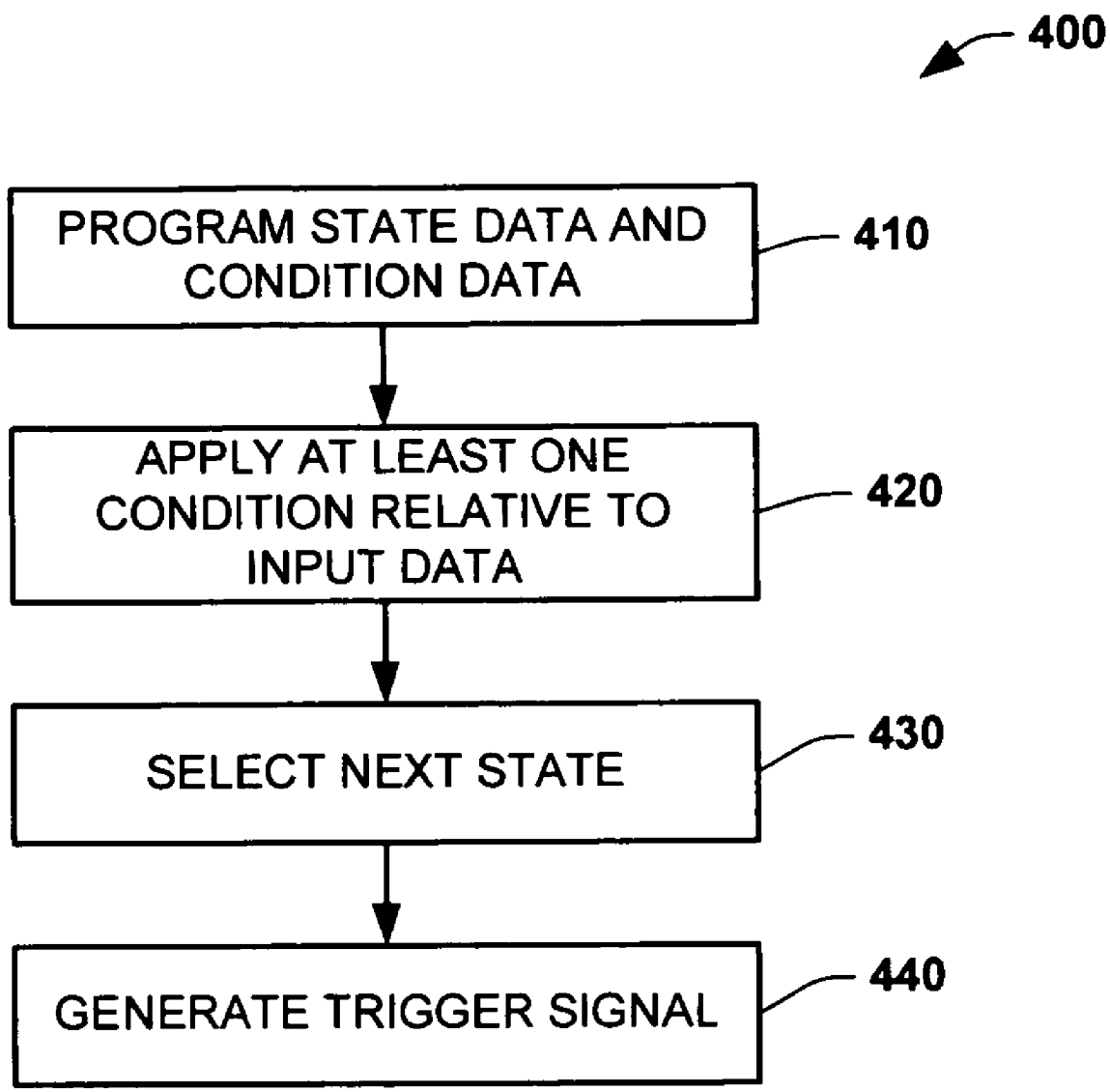
FIG. 8 is a flow diagram depicting an embodiment of a method for generating a trigger signal.

FIG. 8 depicts an example of a method 400 that can be implemented by an integrated circuit. The method 400 includes programming part of the integrated circuit with state data that defines a plurality of possible states for a state machine and with condition data that defines a set of conditions for controlling transitions among the plurality of possible states, as shown at 410. At least one condition of the set of conditions is applied relative to input data (at 420), the applied at least one condition being associated with a current state. At 430, a next state of the plurality of possible states is selected based on the application of the at least one condition that is associated with the current state. At 440, a trigger signal is generated based on the next state corresponding to a predefined one of the plurality of possible states.

What have been described above are examples of the present invention. It is, of course, not possible to describe every conceivable combination of components or methodologies for purposes of describing the present invention, but one of ordinary skill in the art will recognize that many further combinations and permutations of the present invention are possible. For example, any number of one or more systems for controlling capture of data can be implemented in a given ASIC and any number of such ASICs can be integrated into a computer system, a router or other type of electrical circuit system. Accordingly, the present invention is intended to embrace all such alterations, modifications, and variations that fall within the spirit and scope of the appended claims.

What is claimed is:

1. An application specific integrated circuit (ASIC) comprising:
   memory that stores condition data defining conditions for enabling transitions among a plurality of states and next state data defining a next state associated with each of the respective conditions; and
   an embedded logic analyzer, the embedded logic analyzer comprising:
      a state machine circuit that employs the condition data and the next state data to transition from a current state of the state machine circuit to a next state as a function of applying at least one condition relative to input data, the at least one condition being defined by condition data that is associated with the current state, the state machine circuit associating the next state data with the at least one condition based on the current state of the state machine circuit; and
      a control circuit that provides a trigger signal in response to the current state of the state machine circuit transitioning to at least one predefined state of the plurality of states;
      an associated data bus on which the input data propagates; and
      a data capture system that stores a set of data from the associated data bus in response to a store signal indicating a qualified store cycle and based on the trigger signal.

2. The ASIC of claim 1, wherein the state machine circuit further comprises a plurality of condition components corresponding to conditional branches that implement respective conditions defined by the condition data, the state machine circuit transitioning from the current state to a respective next of a plurality of available states based on the results of the respective conditions applied to the input data.

3. The ASIC of claim 2, wherein at least one of the condition components implements at least one of the respective conditions by matching relative to at least one signal, the at least one respective condition varying according to the current state of the state machine circuit, the at least one signal defining the input data.

4. The ASIC of claim 2, further comprising an occurrence system that is operative to set a number of occurrences that a respective condition associated with a given one of the plurality of condition components is met before enabling a transition to the next of the plurality of states for the given one of the plurality of condition components.

5. The ASIC of claim 4, wherein the occurrence system further comprises a counter that provides an indication of a number of occurrences that the respective condition associated with the given one of the plurality of condition components has been met, the state machine circuit enabling a transition from the current state to the next state associated with the given one of the plurality of condition components when the value indicative of the number of occurrences reaches a predefined value.

6. The ASIC of claim 2, wherein the memory is programmable to define the respective conditions that are associated with each of the plurality of condition components and which state of the plurality of states the state machine circuit transitions to based on the respective conditions implemented by the plurality of condition components for the current state.

7. The ASIC of claim 6, wherein the corresponding next state is selected according to a priority assigned to the plurality of condition components.

8. The ASIC of claim 1, wherein the next state data defines at least two possible next states to which the state machine circuit can transition from the current state based on the at least one condition applied relative to the input data.

9. The ASIC of claim 1, wherein the state machine circuit is configured to transition from the current state to the next state up to a rate that is substantially commensurate with a clock cycle for the ASIC, depending on a frequency domain for the input data.

10. The ASIC of claim 1, wherein the at least one condition further comprises a plurality of conditions associated with the current state, the ASIC further comprising a selection system operative to select the next state based on applying the plurality of conditions associated with the current state relative to the input data and according to a priority assigned to the plurality of conditions.

11. The embedded logic analyzer of claim 1, further comprising an occurrence system that is operative to set a number of occurrences that a given condition is met before enabling a transition to the next state associated with the given condition.

12. The embedded logic analyzer of claim 1, further comprising a monitoring system that provides a plurality of signals that define the input data, each of the plurality of signals having a value that varies as a function of performance of data on the associated bus, the state machine circuit applying the conditions associated with the current state to the plurality of signals to enable a transition from the current state to the next state.

13. The embedded logic analyzer of claim 12, further comprising a qualification system that provides the store signal by qualifying data for a given store cycle as a function of at least a portion of the plurality of signals.

14. The embedded logic analyzer of claim 13, wherein the monitoring system further comprises a plurality of performance monitoring subsystems, each of the plurality of performance monitoring subsystems providing a condition signal according to a measure of performance monitored by each respective one of the plurality of performance monitoring subsystems each data cycle, the control circuit providing the trigger signal based on at least a portion of the condition signals, and the qualification system providing the store signal based on at least a portion of the condition signals indicating a qualified store cycle.

15. A computer system comprising at least one embedded logic analyzer of claim 1, the computer system comprising at least one processor that is operative to program the memory with at least one of the condition data and the next state data.

16. A system comprising:
    a state machine operative to transition from a current state to a next state of a plurality of states, the next state being associated with a plurality of programmable conditions generated by respective condition circuitry configured according to the current state of the state machine, the state machine transitioning from the current state to a corresponding next state as a function of applying input data relative to the plurality of programmable conditions, the transition from the current state to the next state occurring up to a rate that is substantially commensurate with a clock cycle of the system depending on a frequency domain of the input data, a trigger signal being generated in response to the state machine transitioning to a predefined state of the plurality of states; and
    a selection system operative to select the next state based on the plurality of programmable conditions that are applied to the input data for the current state according to a priority assigned to the respective condition circuitry.

17. The system of claim 16, wherein the state machine further comprises condition circuitry operative to apply the at least one programmable condition relative to the input data to determine the corresponding next state.

18. The system of claim 17, further comprising memory that is communicatively coupled with the condition circuitry of the state machine, the memory being programmable to store condition data that defines the at least one programmable condition, the memory also storing state data that defines which state to transition to in response to the input data meeting the at least one programmable condition applied by the condition circuitry.

19. The system of claim 18, further comprising control circuitry that provides a trigger signal in response to the current state of the state machine transitioning to the final state of the plurality of states.

20. The system of claim 17, wherein the at least one programmable condition further comprises a plurality of conditions, wherein the condition circuitry further comprises a plurality of condition components that apply the plurality of respective conditions, each of the plurality of condition components corresponding to a conditional branch of the state machine that is operative to effect a transition from the current state to a respective next of a plurality of available states based on the results of the respective condition applied by each of the plurality of condition components to the plurality of signals.

21. The system of claim 20, wherein the next state is selected according to a priority assigned to each of the plurality of condition components that is associated with the current state.

22. A system comprising:
    a state machine operative to transition from a current state to a next state of a plurality of states, the next state being associated with at least one programmable condition component that is configured according to the current state of the state machine, the state machine transitioning from the current state to a corresponding next state as a function of applying input data relative to the at least one programmable condition, the transition from the current state to the next state occurring up to a rate that is substantially commensurate with a clock cycle of the system depending on a frequency domain of the input data, a trigger signal being generated in response to the state machine transitioning to a final state of the plurality of states; and
    an occurrence system that is operative to set a number of occurrences that the at least one programmable condition is met before enabling a transition to the corresponding next state.

23. An application specific integrated circuit comprising the system of claim 16, the application specific integrated circuit comprising an embedded logic analyzer, the embedded logic analyzer comprising:
    the state machine;
    an associated bus on which the input data propagates;

a monitoring system that provides a plurality of signals, each of the plurality of signals having a value that varies as a function of performance of corresponding data on the associated bus, the state machine applying the at least one programmable condition associated with the current state to the plurality of signals to determine a transition from the current state to the corresponding next state;

a qualification system that provides a store signal by qualifying data on the associated bus for a given store cycle as a function of at least a portion of the plurality of signals;

a control circuit that provides the trigger signal in response to the current state of the state machine circuit transitioning to the predefined final state of the plurality of states; and a data capture system that stores a set of data from the associated data source in response to the store signal and based on the trigger signal.

24. A computer system comprising at least one embedded logic analyzer according to claim 23, the computer system comprising at least one processor that is operative to program the memory with at least the condition data and the next state data.

25. A system comprising:

means for storing state data that defines a plurality of possible states;

means for storing condition data that defines a set of conditions associated with the plurality of possible states;

means for applying input data relative to at least one condition of the set of conditions that is associated with a current state;

means for setting a number of occurrences that the at least one condition of the set of conditions is met before enabling a transition to a selected next state;

means for selecting the next state of the plurality of possible states based on the application of the at least one condition of the set of conditions that is associated with the current state and the number of occurrences that the at least one condition of the set of conditions is met; and means for providing a trigger signal based on the selected next state corresponding to a predefined one of the plurality of possible states.

26. The system of claim 25, wherein the means for applying further comprises a plurality of conditional branches that employ respective conditions from the set of conditions for transitioning from the current state to a respective next state based on application of the respective conditions applied by the conditional branches to the input data for the current state.

27. The system of claim 26, wherein the means for selecting selects the respective next state according to a priority assigned to the plurality of conditional branches and the results of respective conditions associated with the plurality of conditional branches applied to the input data.

28. The system of claim 25, wherein the means for applying and the means for selecting are configured to implement a transition from the current state to the next state up to a rate that is substantially commensurate with a clock cycle for the system.

29. The system of claim 25, further comprising an embedded logic analyzer, the embedded logic analyzer comprising:

means for monitoring data from an associated data bus and for providing a plurality of signals indicative of corresponding performance conditions associated with the data on the associated data bus, the plurality of signals defining the input data;

means for qualifying storage of the data from the associated data bus as a function of the plurality of signals and for providing a store signal that indicates a qualified store cycle for storing data from the associated data bus;

means for storing data from the associated data bus each qualified store cycle in response to the store signal while enabled based on the store signal.

30. A method implemented by an integrated circuit, the method comprising:

programming part of the integrated circuit with state data that defines a plurality of possible states for a state machine and with condition data that defines a set of conditions for controlling transitions among the plurality of possible states;

applying at least one condition of the set of conditions relative to input data, the applied at least one condition being associated with a current state;

selecting a next state of the plurality of possible states based on the application of the at least one condition that is associated with the current state;

comparing the next state of the plurality of possible states with a predefined one of the plurality of possible states; and generating a trigger signal based on the next state corresponding to the predefined one of the plurality of possible states.

31. The method of claim 30, wherein a plurality of conditional branches employ respective conditions from the set of conditions for enabling a transition from the current state to a respective next state based on application of the respective conditions associated with the conditional branches relative to the input data.

32. The method of claim 31, wherein the respective next state is selected according to a priority assigned to the plurality of conditional branches.

33. The method of claim 30, further comprising setting a number of occurrences that the at least one condition of the set of conditions is met before enabling a transition to the next state that is associated with the at least one condition of the set of conditions.

34. The method of claim 30, wherein a transition from the current state to the next state can be implemented up to a rate that is substantially commensurate with a clock cycle that is associated with the integrated circuit implementing the method.

35. The method of claim 30, further comprising:

monitoring data from an associated data bus and for providing a plurality of signals indicative of corresponding performance conditions associated with the data on an associated data bus, the plurality of signals defining the input data;

qualifying storage of the data from the associated data bus as a function of the plurality of signals and for providing a store signal that indicates a qualified store cycle for storing data from the associated data source;

storing data from the associated data bus each qualified store cycle in response to the store signal while enabled based on the trigger signal.

* * * * *